(12) United States Patent
Shang et al.

(10) Patent No.: US 12,490,600 B2
(45) Date of Patent: Dec. 2, 2025

(54) DISPLAY PANEL, AND METHOD FOR MANUFACTURING SAME AND DISPLAY DEVICE

(71) Applicants: Chengdu BOE Optoelectronics Technology Co., Ltd., Sichuan (CN); BOE Technology Group Co., Ltd., Beijing (CN)

(72) Inventors: Tinghua Shang, Beijing (CN); Yi Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 138 days.

(21) Appl. No.: 17/796,706

(22) PCT Filed: Oct. 25, 2021

(86) PCT No.: PCT/CN2021/126115
§ 371 (c)(1),
(2) Date: Aug. 1, 2022

(87) PCT Pub. No.: WO2022/160807
PCT Pub. Date: Aug. 4, 2022

(65) Prior Publication Data
US 2024/0224620 A1    Jul. 4, 2024

(30) Foreign Application Priority Data

Jan. 28, 2021   (CN) .......................... 202110116496.9

(51) Int. Cl.
*H10K 59/124*  (2023.01)
*H10D 86/01*  (2025.01)
(Continued)

(52) U.S. Cl.
CPC ......... *H10K 59/124* (2023.02); *H10D 86/451* (2025.01); *H10K 59/1201* (2023.02); *H10K 59/1213* (2023.02); *H10K 59/131* (2023.02)

(58) Field of Classification Search
CPC ............. H10K 59/124; H10K 59/1201; H10K 59/131; H10K 59/1213; H10D 86/451
See application file for complete search history.

(56) References Cited

U.S. PATENT DOCUMENTS

2009/0078939 A1   3/2009  Yamazaki et al.
2014/0340625 A1*  11/2014  Hsu ..................... G02F 1/13454
                                                    445/24
(Continued)

FOREIGN PATENT DOCUMENTS

CN       104600030  A  *  5/2015
CN       104966721  A  *  10/2015
(Continued)

OTHER PUBLICATIONS

CN202110116496.9 first office action.
CN202110116496.9 second office action.

*Primary Examiner* — Jeff W Natalini
*Assistant Examiner* — Brandon C Fox
(74) *Attorney, Agent, or Firm* — IPro, PLLC

(57) ABSTRACT

Provided is a display panel. The display panel comprises a base substrate; a gate metal layer and a source/drain metal layer sequentially laminated on a side of the base substrate; and an inorganic insulating layer and an organic planarization layer sequentially laminated between the gate metal layer and the source/drain metal layer; wherein an orthographic projection of the gate metal layer on the base substrate and an orthographic projection of the source/drain metal layer on the base substrate have an overlapped portion, (Continued)

and an orthographic projection of the organic planarization layer on the substrate overlaps the overlapped portion.

13 Claims, 9 Drawing Sheets

(51) Int. Cl.
  *H10D 86/40* (2025.01)
  *H10K 59/12* (2023.01)
  *H10K 59/121* (2023.01)
  *H10K 59/131* (2023.01)

(56) References Cited

U.S. PATENT DOCUMENTS

| | | | |
|---|---|---|---|
| 2017/0025637 A1* | 1/2017 | Kim | H10K 59/1213 |
| 2019/0189721 A1* | 6/2019 | Kim | H10D 86/443 |
| 2019/0333461 A1* | 10/2019 | Kikuchi | H10D 30/6755 |
| 2021/0226137 A1* | 7/2021 | Zhao | H10K 71/10 |
| 2022/0157923 A1 | 5/2022 | Zhao | |

FOREIGN PATENT DOCUMENTS

| | | | | |
|---|---|---|---|---|
| CN | 111415969 A | * | 7/2020 | G09F 9/301 |
| CN | 112951846 A | | 6/2021 | |
| JP | 2006310509 A | | 11/2006 | |

* cited by examiner

DISPLAY PANEL, AND METHOD FOR MANUFACTURING SAME AND DISPLAY DEVICE

CROSS-REFERENCE TO RELATED APPLICATION

The present disclosure is a U.S. national stage of international application No. PCT/CN2021/126115, filed on Oct. 25, 2021, which claims priority to Chinese Patent Application 202110116496.9, filed on Jan. 28, 2021 and entitled "DISPLAY PANEL, MANUFACTURING METHOD THEREOF AND DISPLAY DEVICE", the entire contents of which are incorporated herein by reference.

TECHNICAL FIELD

The present disclosure relates to the field of display technologies, and in particular, relates to a display panel and a method for manufacturing the same, and a display device.

BACKGROUND

Active-matrix organic light-emitting diode (AMOLED) display panels are widely used in the display field due to their advantages of self-luminescence, fast response speed and the like.

SUMMARY

Embodiments of the present disclosure provide a display panel and a method for manufacturing the same, and a display device.

The technical solutions are as follows.

In an aspect, a display panel is provided. The display includes
a base substrate;
a gate metal layer and a source/drain metal layer sequentially laminated on a side of the base substrate; and
an inorganic insulating layer and an organic planarization layer sequentially laminated between the gate metal layer and the source/drain metal layer;
wherein an orthographic projection of the gate metal layer on the base substrate and an orthographic projection of the source/drain metal layer on the base substrate have an overlapped portion, and an orthographic projection of the organic planarization layer on the substrate overlaps the overlapped portion.

Optionally, the gate metal layer and the source/drain metal layer are sequentially laminated along a direction away from the base substrate.

Optionally, the inorganic insulating layer and the organic planarization layer are sequentially laminated along the direction away from the base substrate.

Optionally, the base substrate is provided with a display region and a non-display region surrounding the display region; wherein the organic planarization layer is disposed in the display region; and
each of the source/drain metal layer, the gate metal layer and the inorganic insulating layer is disposed in the display region and the non-display region.

Optionally, the orthographic projection of the organic planarization layer on the base substrate covers the overlapped portion.

Optionally, a dielectric constant of a material of the organic planarization layer is greater than or equal to 3 and less than or equal to 4.

Optionally, the gate metal layer includes: a first gate metal layer and a second gate metal layer sequentially laminated along a direction away from the base substrate; and the inorganic insulating layer comprises:
a first gate insulating layer disposed between the first gate metal layer and the second gate metal layer; and
an interlayer dielectric (ILD) layer disposed between the second gate metal layer and the source/drain metal layer.

Optionally, the display panel further includes:
an inorganic layer substrate, an active layer and a second gate insulating layer disposed between the gate metal layer and the base substrate and sequentially laminated along a direction away from the base substrate; and
a target planarization layer, a pixel electrode and a pixel definition layer sequentially laminated on a side of the source/drain metal layer away from the base substrate;
wherein the source/drain metal layer is connected to the active layer through a via hole penetrating the organic planarization layer, the inorganic insulating layer and the second gate insulating layer.

Optionally, the via hole includes: a first via hole penetrating the organic planarization layer, and a second via hole penetrating the inorganic insulating layer and the second gate insulating layer, wherein
an orthographic projection of an opening, close to the base substrate, of the first via hole on the base substrate coincides with an orthographic projection of an opening, away from the base substrate, of the second via hole on the base substrate.

In another aspect, a method for manufacturing a display panel is provided. The method includes:
providing a base substrate;
forming a gate metal layer and a source/drain metal layer sequentially laminated on a side of the base substrate; and
forming an inorganic insulating layer and an organic planarization layer sequentially laminated between the gate metal layer and the source/drain metal layer;
wherein an orthographic projection of the gate metal layer on the base substrate and an orthographic projection of the source/drain metal layer on the base substrate have an overlapped portion, and an orthographic projection of the organic planarization layer on the substrate overlaps the overlapped portion.

Optionally, forming the gate metal layer and the source/drain metal layer sequentially laminated on the side of the base substrate includes:
forming the gate metal layer on the side of the base substrate; and
forming the source/drain metal layer on a side of the gate metal layer away from the base substrate.

Optionally, forming the inorganic insulating layer and the organic planarization layer sequentially laminated between the gate metal layer and the source/drain metal layer includes:
forming an inorganic material layer on the side of the gate metal layer away from the base substrate;
forming the organic planarization layer with a first via hole on a side of the inorganic material layer away from the gate metal layer; and
etching the inorganic material layer by using the organic planarization layer as a protective layer to form the inorganic insulating layer with a second via hole;
wherein an orthographic projection of the first via hole on the base substrate overlaps an orthographic projection of the second via hole on the base substrate.

Optionally, forming the inorganic insulating layer and the organic planarization layer sequentially laminated between the gate metal layer and the source/drain metal layer includes:

forming an inorganic material layer on the side of the gate metal layer away from the base substrate;

forming a photoresist pattern on a side of the inorganic material layer away from the gate metal layer;

etching the inorganic material layer by using the photoresist pattern as a protective layer to form the inorganic insulating layer with a second via hole;

stripping off the photoresist pattern; and forming the organic planarization layer with a first via hole on a side of the inorganic insulating layer away from the gate metal layer;

wherein an orthographic projection of the first via hole on the base substrate overlaps an orthographic projection of the second via hole on the base substrate.

In still another aspect, a display device is provided. The display device includes: a driver IC, and the display panel described in the above first aspect; wherein the driver IC is connected to the display panel and configured to drive the display panel to display

BRIEF DESCRIPTION OF THE DRAWINGS

To describe the technical solutions in the embodiments of the present disclosure more clearly, the following briefly describes the accompanying drawings required for describing the embodiments. Apparently, the accompanying drawings in the following description show merely some embodiments of the present disclosure, and those of ordinary skill in the art may still derive other drawings from these accompanying drawings without creative efforts.

DETAILED DESCRIPTION

For clearer descriptions of the objects, technical solutions and advantages in the present disclosure, the present disclosure is described in further detail hereinafter with reference to the accompanying drawings.

In the related art, an AMOLED display panel includes a base substrate, and a gate metal layer, an inorganic insulating layer and a source/drain metal layer which are sequentially laminated on a side of the base substrate. An orthographic projection of the gate metal layer on the base substrate overlaps an orthographic projection of the source/drain metal layer on the base substrate.

In recent years, display products with high refresh rates have emerged one after another. For a display panel driven row by row, in order to achieve a higher refresh rate, shorter refresh time duration is left for each row of pixels. As such, a faster signal switching speed is required. The signal here refers to a data signal for charging the pixels. Correspondingly, the requirements for the driving capability of a driver integrated circuit (driver IC) that provides data signals are getting higher and higher, and the power consumption of the driver IC increases accordingly.

In addition, research has found that the load on the signal line transmitting the data signals affects the signal switching speed. The larger the load is, the slower the signal switching speed is, which further causes the power consumption of the driver IC to increase. As such, the service life of the driver IC is affected and finally the display effect of the display panel is affected. Optionally, the loads on the signal lines include multiple types of loads, one of which is the capacitive load brought by the overlap capacitance formed by overlap of the gate metal layer and the source/drain metal layer which are laminated. In the related art, the large the capacitance value of the overlap capacitance is, and the larger the capacitive load brought by the overlap capacitance is, which in turn causes the signal switching speed to be slower. As such, the power consumption of the driver IC is higher, which is unfavorable for achieving a high refresh rate.

Embodiments of the present disclosure provide a display panel. Compared with the related art, the capacitance value of the overlap capacitance formed by the gate metal layer and the source/drain metal layer in the display panel is smaller, and correspondingly, the capacitive load brought by the overlap capacitance is smaller. In this way, the signal switching speed is improved, and the power consumption of the driver IC is reduced, which facilitates the design of high refresh rate.

Figure 1:
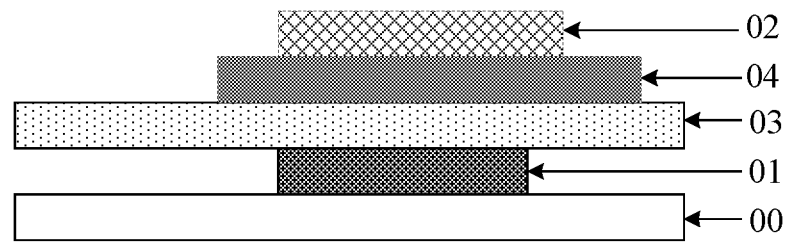
FIG. 1 is a schematic structural diagram of a display panel according to an embodiment of the present disclosure.

FIG. 1 is a schematic structural diagram of a display panel according to an embodiment of the present disclosure. As shown in FIG. 1, the display panel may include:

a base substrate 00, and a gate metal layer (gate) 01 and a source/drain metal layer (source&drain, SD) 02 which are sequentially laminated on a side of the base substrate 00, and an inorganic insulating layer 03 and an organic planarization (PLN) layer 04 which are sequentially laminated between the gate metal layer 01 and the source/drain metal layer 02.

Here, the orthographic projection of the gate metal layer 01 on the base substrate 00 and the orthographic projection of the source/drain metal layer 02 on the base substrate 00 have an overlapped portion, and the orthographic projection of the organic planarization layer 04 on the base substrate 00 overlaps the overlapped portion. That is, referring to FIG. 1, the orthographic projection of the gate metal layer 01 on the base substrate 00, the orthographic projection of the source/drain metal layer 02 on the base substrate 00, and the orthographic projection of the organic planarization layer 04 on the base substrate 00 at least partially overlap with each other. In this way, the newly added organic planarization layer 04 can increase the distance between the gate metal layer 01 and the source/drain metal layer 02.

The smaller the distance between two laminated film layers is, the larger the capacitance value of the overlap capacitance formed by the two film layers is; and the smaller the distance between two laminated film layers is, the larger the capacitance value of the overlap capacitance formed by the two film layers is. That is, according to the principle that the capacitance value of the overlap capacitance formed by two laminated film layers is negatively correlated with the distance between the two film layers, it can be known that in the embodiments of the present disclosure, by increasing the distance between the gate metal layer 01 and the source/drain metal layer 02, the capacitance value of the overlap capacitance formed by the gate metal layer 01 and the source/drain metal layer 02 can be effectively reduced. Based on the descriptions of the above embodiment, it can be known that the purpose of reducing the capacitive load can be achieved when the capacitance value is reduced. Therefore, the power consumption of the driver IC can be reduced on the premise of facilitating the design of a high refresh rate.

In summary, the embodiment of the present disclosure provides a display panel. The display panel includes a gate metal layer and a source/drain metal layer that are sequentially laminated on a side of a base substrate, and an inorganic insulating layer and an organic planarization layer that are sequentially laminated between the gate metal layer and the source/drain metal layer. Since the display panel further includes an organic planarization layer, and the orthographic projection of the organic planarization layer on the base substrate overlaps the overlapped portion of the orthographic projection of the gate metal layer on the base substrate and the orthographic projection of the source/drain metal layer on the base substrate, the distance between the gate metal layer and the source/drain metal layer is increased, and accordingly, the capacitance value of the overlap capacitance formed by the gate metal layer and the source/drain metal layer is reduced. In this way, the capacitive load brought by the overlap capacitance is smaller, and the power consumption of the driver IC driving the display panel to display is lower.

Optionally, referring to the display panel shown in FIG. 1, the gate metal layer 01 and the source/drain metal layer 02 may be sequentially laminated along the direction away from the base substrate 00. That is, the display panel in the embodiments of the present disclosure may have a bottom-gate structure. Certainly, in some embodiments, the display panel may also have a top-gate structure, i.e., the source/drain metal layer 02 and the gate metal layer 01 are sequentially laminated along the direction away from the base substrate 00.

Optionally, still referring to the display panel shown in FIG. 1, the inorganic insulating layer 03 and the organic planarization layer 04 may be sequentially laminated along the direction away from the base substrate 00. That is, in the embodiments of the present disclosure, the organic planarization layer 04 may be farther away from the base substrate 00 than the inorganic insulating layer 03 is.

For the display panel with the structure shown in FIG. 1, the gate metal layer 01, the inorganic insulating layer 03, the organic planarization layer 04 and the source/drain metal layer 02 may be sequentially laminated along the direction away from the base substrate 00.

In combination with the display panel shown in FIG. 1, other film layer structures (e.g., an encapsulation layer) may be generally disposed on the side of the source/drain metal layer 02 away from the base substrate 00. Therefore, by disposing the organic planarization layer 04 on the side, proximal to the base substrate 00, of the source/drain metal layer 02, it can be ensured that other film layer structures have better flatness, thereby ensuring better yield of the display panel.

In some embodiments, the organic planarization layer 04 may be closer to the base substrate 00 than the inorganic insulating layer 03 is. That is, the organic planarization layer 04 and the inorganic insulating layer 03 may be sequentially laminated along the direction away from the base substrate 00.

Optionally, still referring to FIG. 1, in the embodiments of the present disclosure, the orthographic projection of the organic planarization layer 04 on the base substrate 00 may cover the overlapped portion of the gate metal layer 01 and the source/drain metal layer 02. In this way, any distance between the overlapped portion of the gate metal layer 01 and the source/drain metal layer 02 is larger, which further effectively reduces the capacitance value of the overlap capacitance formed by the gate metal layer 01 and the source/drain metal layer 02. Accordingly, the capacitive load brought by the overlap capacitance can be further effectively reduced, and the power consumption of the driver IC can be reduced.

Optionally, the dielectric constant of the material of the organic planarization layer 04 described in the embodiments of the present disclosure may be greater than or equal to 3 and less than or equal to 4. For example, the material of the organic planarization layer 04 may include polyimide.

Figure 2:
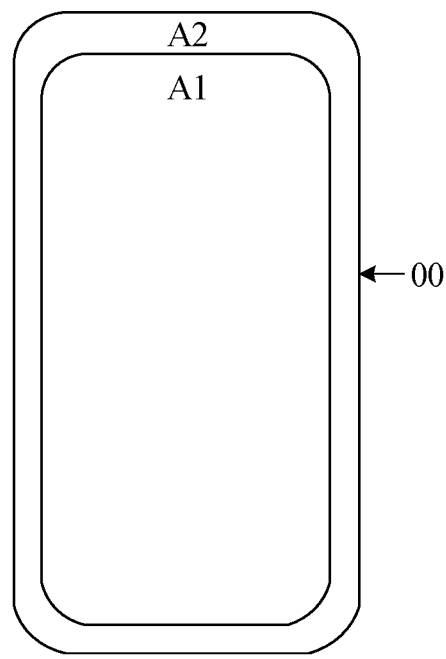
FIG. 2 is a schematic structural diagram of another display panel according to an embodiment of the present disclosure.

Optionally, FIG. 2 is a schematic structural diagram of another display panel according to an embodiment of the present disclosure. As shown in FIG. 2, the base substrate 00 may include a display region A1 and a non-display region A2 surrounding the display region A1.

Figure 3:
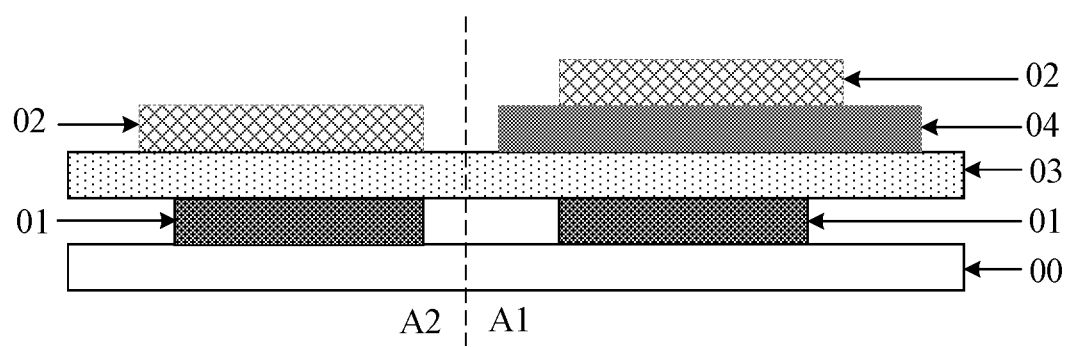
FIG. 3 is a schematic structural diagram of still another display panel according to an embodiment of the present disclosure.

Optionally, FIG. 3 is a schematic structural diagram of another display panel according to an embodiment of the present disclosure. In combination with FIG. 2 and FIG. 3, it can be seen that the organic planarization layer 04 in the embodiments of the present disclosure may be disposed in the display region A1 only, and each of the source/drain metal layer 02, the gate metal layer 01 and the inorganic insulating layer 03 may be disposed in both the display region A1 and the non-display region A2. FIG. 3 only shows part of the display region A1 and part of the non-display region A2.

It should be noted that the display region A1 may be provided with a plurality of pixels arranged in an array, and each pixel may include a pixel circuit and a light-emitting element. The pixel circuit may be connected to a gate line, a data line and the light-emitting element, and the pixel circuit is configured to transmit a data signal from the data line to the light-emitting element under the control of a gate driving signal provided by the gate line, so as to drive the light-emitting element to emit light. Moreover, the pixel circuit generally includes a driving transistor.

It should also be noted that a gate on array circuit (GOA circuit for short) for transmitting the gate driving signal to the gate line may be disposed on the base substrate 00 and may be disposed in the non-display region A2. Therefore, the non-display region A2 in the embodiments of the present disclosure may include a GOA region for arranging the GOA circuit and other region. In addition, the GOA region and the other region may be sequentially arranged along the direction away from the display region A1. Moreover, the GOA circuit generally includes a plurality of thin film transistors.

Optionally, with reference to FIG. 3, the gate metal layer 01 and the source/drain metal layers 02 disposed in the display region A1 may constitute the transistor in the pixel circuit described above. The gate metal layer 01 and the source/drain metal layer 02 disposed in the non-display region A2 may constitute the thin film transistor in the GOA circuit described above. The data signal is generally provided to the light-emitting element only by the pixel circuit in the display region A1, but not provided to the circuit structure in the non-display region A2. According to the introduction of the signal switching speed in the above-mentioned embodiments, it can be known that adding the organic planarization layer 04 between the gate metal layer 01 and the source/drain metal layer 02 that are disposed in the non-display region A2 has no significant effect on reducing the power consumption of the driver IC. Thus, by adding the organic planarization layer 04 in the display region A1 only, the power consumption of the driver IC can be effectively reduced, and meanwhile the structure of the display panel can be simplified, and the manufacturing cost can be reduced.

Certainly, in some embodiments, the organic planarization layer 04 may also be disposed in the non-display region A2.

Figure 4:
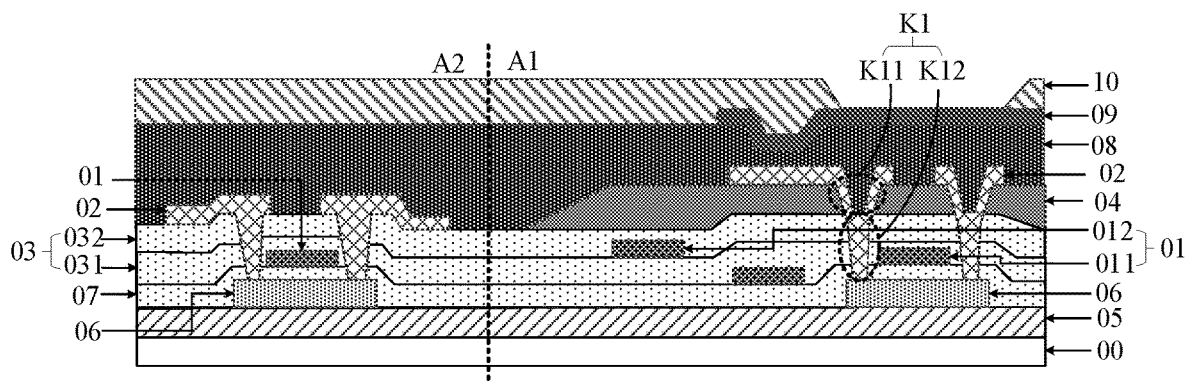
FIG. 4 is a schematic structural diagram of still another display panel according to an embodiment of the present disclosure.
Figure 5:
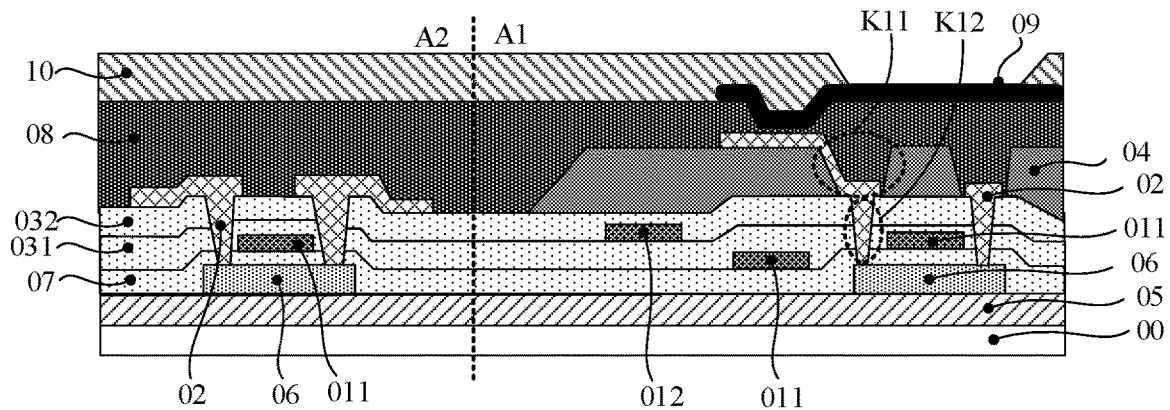
FIG. 5 is a schematic structural diagram of still another display panel according to an embodiment of the present disclosure.

Optionally, FIG. 4 is a schematic structural diagram of still another display panel according to an embodiment of the present disclosure. FIG. 5 is a schematic structural diagram of still another display panel according to an embodiment of the present disclosure.

Referring to FIG. 4 and FIG. 5, it can be seen that, in the embodiments of the present disclosure, the gate metal layer 01 may include a first gate metal layer 011 and a second gate metal layer 012 that are sequentially laminated along the direction away from the base substrate 00. Correspondingly, the inorganic insulating layer 03 may include a first gate insulating (GI) layer 031 disposed between the first gate metal layer 011 and the second gate metal layer 012, and an interlayer dielectric (ILD) layer 032 disposed between the second gate metal layer 012 and the source/drain metal layer 02.

By disposing an insulating layer between every two adjacent conductive film layers, the mutual influence of signals can be effectively avoided, and the display effect of the display panel can be ensured.

Optionally, the dielectric constant of the material of the first gate insulating layer 031 may be about 7. The dielectric constant of the material of the ILD layer 032 may be greater than or equal to 3 and less than or equal to 4.

Optionally, the materials of the first gate insulating layer 031 and the ILD layer 032 may include at least one of silicon nitride (SiN), silicon oxide (SiO), and silicon oxynitride (SiNO).

Optionally, still referring to FIG. 4 and FIG. 5, it can be seen that the display panel in the embodiments of the present disclosure may further include: an inorganic layer substrate 05, an active (poly) layer 06 and a second gate insulating layer 07 which are disposed between the gate metal layer 01 and the base substrate 00 and sequentially laminated along in the direction away from the base substrate 00, and a target planarization layer 08, a pixel electrode 09 and a pixel definition layer (PDL) 10 which are sequentially laminated on the side of the source/drain metal layer 02 away from the base substrate 00.

Optionally, the pixel electrode 09 may be an anode or a cathode, and the embodiments of the present disclosure are described by taking the pixel electrode 09 being an anode as an example. Each film layer such as the inorganic layer substrate 05, the active layer 06, the second gate insulating layer 07, the target planarization layer 08 and the pixel definition layer 10 may be disposed in both the display region A1 and the non-display region A2, respectively. The pixel electrode 09 may be disposed in the display region A1 only.

The source/drain metal layer 02 may be connected to the active layer 06 through a via hole K1 penetrating the organic planarization layer 04, the inorganic insulating layer 03 and the second gate insulating layer 07. As such, referring to FIG. 4 and FIG. 5, the via hole K1 may be divided into a first via hole K11 penetrating the organic planarization layer 04 and a second via hole K12 penetrating the inorganic insulating layer 03 and the second gate insulating layer 07.

Optionally, referring to the display panel shown in FIG. 4, the orthographic projection of an opening, close to the base substrate 00, of the first via hole K11 on the base substrate 00 may coincide with the orthographic projection of an opening, away from the base substrate 00, of the second via hole K12 on the base substrate 00. That is, the opening of the first via hole K11 and the opening of the second via hole K12 may have the same size at the intersection of the two via holes.

By testing, such arrangement can reduce the influence of the first via hole K1/ penetrating the organic planarization layer 04 on the flatness of other film layers (e.g., pixel electrode) disposed on the first via hole K1/ on the premise of ensuring the reliable connection between the source/drain metal layer 02 and the active layer 06, thereby avoiding adverse influence on light emission of the pixels.

Certainly, in some embodiments, referring to the display panel shown in FIG. 5, the orthographic projection of the opening, close to the base substrate 00, of the first via hole K11 on the base substrate 00 may cover the orthographic projection of the opening, distal from the base substrate 00), of the second via hole K12 on the base substrate 00. That is, at the intersection of the first via hole K11 and the second via hole K12, the size of the opening of the first via hole K1/ is relatively large, and the size of the opening of the second via hole K12 is relatively small. In this way, it's ensured that the second via hole K12 penetrating the inorganic insulating layer 03 and the second gate insulating layer 07 can be reliably etched, thereby ensuring the reliable connection between the source/drain metal layer 02 and the active layer 06.

It should be noted that, for the region where the organic planarization layer 04 is not added (e.g., the non-display region A2 shown in FIG. 4 and FIG. 5), the source/drain metal layer 02 may be reliably connected to the active layer 06 through the via hole (i.e., the second via hole K12) penetrating the inorganic insulating layer 03 and the second gate insulating layer 07. In addition, the film layers are marked in different ways in FIG. 4 and FIG. 5.

In summary, the embodiment of the present disclosure provides a display panel.

The display panel includes a gate metal layer and a source/drain metal layer that are sequentially laminated on a side of a base substrate, and an inorganic insulating layer and an organic planarization layer that are sequentially laminated between the gate metal layer and the source/drain metal layer. Since the display panel further includes an organic planarization layer, and the orthographic projection of the organic planarization layer on the base substrate overlaps the overlapped portion of the orthographic projection of the gate metal layer on the base substrate and the orthographic projection of the source/drain metal layer on the base substrate, the distance between the gate metal layer and the source/drain metal layer is increased, and accordingly, the capacitance value of the overlap capacitance formed by the gate metal layer and the source/drain metal layer is reduced. In this way, the capacitive load brought by the overlap capacitance is smaller, and the power consumption of the driver IC driving the display panel to display is lower.

Figure 6:
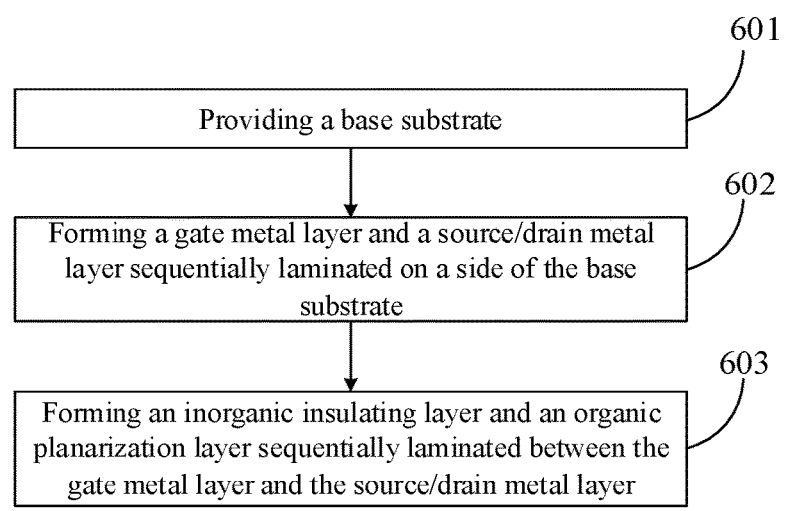
FIG. 6 is a flowchart of a method for manufacturing a display panel according to an embodiment of the present disclosure.

FIG. 6 is a flowchart of a method for manufacturing a display panel according to an embodiment of the present disclosure. The method may be applied to manufacture the display panel as described in any one of FIG. 1 to FIG. 5. As shown in FIG. 6, the method may include the following steps.

In step 601, a base substrate is provided.

Optionally, the base substrate may be a flexible substrate made of a flexible material, or may also be a glass substrate.

In step 602, a gate metal layer and a source/drain metal layer sequentially laminated are formed on a side of the base substrate.

In step 603, an inorganic insulating layer and an organic planarization layer sequentially laminated between the gate metal layer and the source/drain metal layer are formed.

Here, the orthographic projection of the gate metal layer on the base substrate and the orthographic projection of the source/drain metal layer on the base substrate have an overlapped portion, and the orthographic projection of the organic planarization layer on the base substrate overlaps the overlapped portion.

In summary, the embodiment of the present disclosure provides a method for manufacturing a display panel. The display panel manufactured by this method further includes an organic planarization layer between the gate metal layer and the source/drain metal layer, and the orthographic projection of the organic planarization layer on the base substrate overlaps the overlapped portion of the orthographic projection of the gate metal layer on the base substrate and the orthographic projection of the source/drain metal layer on the base substrate. Therefore, the distance between the gate metal layer and the source/drain metal layer is increased, and accordingly, the capacitance value of the overlap capacitance formed by the gate metal layer and the source/drain metal layer is reduced. In this way, the capacitive load brought by the overlap capacitance is smaller, and the power consumption of the driver IC driving the display panel to display is lower.

Figure 7:
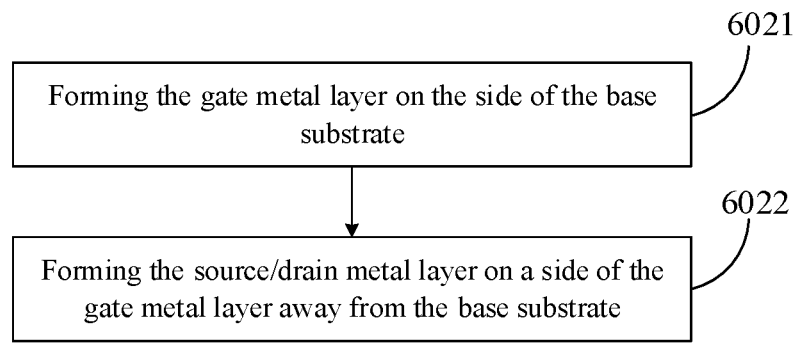
FIG. 7 is a flowchart of a method for manufacturing a gate metal layer and a source/drain metal layer according to an embodiment of the present disclosure.

Optionally, as shown in FIG. 7, the foregoing step 602 may include the following steps.

In step 6021, the gate metal layer is formed on the side of the base substrate.

In step 6022, the source/drain metal layer is formed on a side of the gate metal layer away from the base substrate.

The display panel formed according to the manufacturing sequence corresponding to the method shown in FIG. 7 is the display panel with the bottom-gate structure shown in FIG. 1 to FIG. 5. Certainly, in the case that a display panel with a top-gate structure is to be formed, the sequence of step 6021 and step 6022 may be reversed.

Figure 8:
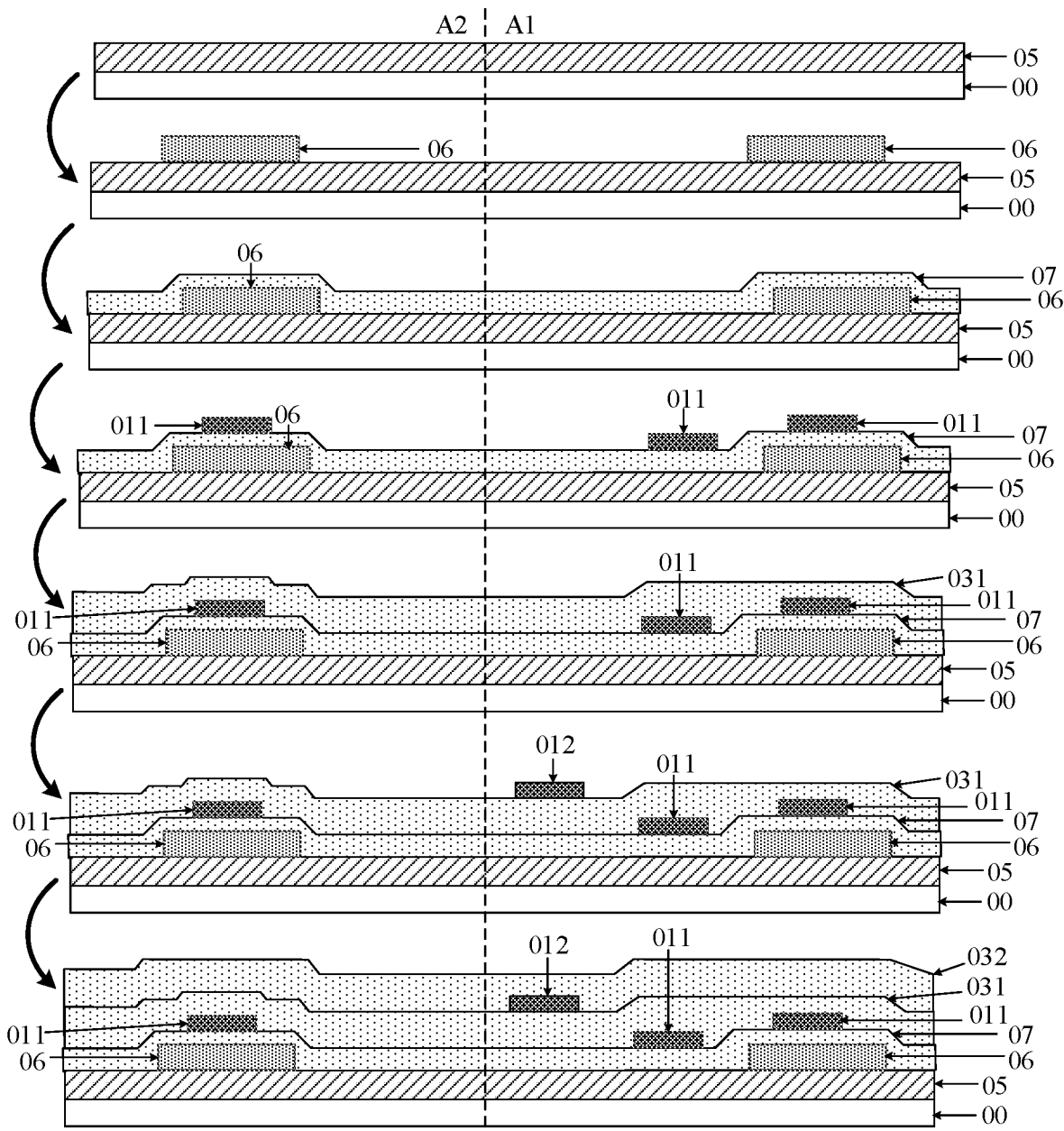
FIG. 8 is a partial schematic diagram in a flowchart of a manufacturing process according to an embodiment of the present disclosure.

In addition, regardless of whether the display panel with the structure shown in FIG. 4 or FIG. 5 is to be formed, it can be seen from the partial process flowchart shown in FIG. 8 that the following method is performed first after the base substrate 00 is provided.

(1) An inorganic layer substrate 05 is first formed in a display region A1 and a non-display region A2 of the base substrate 00. (2) An active layer 06 is formed on the side of the inorganic layer substrate 05 away from the base substrate 00. Here, an active layer 06 may be formed in both the display region A1 and the non-display region A2. (3) A second gate insulating layer 07 is formed on the side of the active layer 06 away from the inorganic layer substrate 05. The second gate insulating layer 07 here has not been etched, that is, the second gate insulating layer 07 here is provided with no via hole. (4) A first gate metal layer 011 (i.e., a portion of the gate metal layer 01) is formed on the side of the second gate insulating layer 07 away from the active layer 06. The first gate metal layer 011 may be formed in both the display region A1 and the non-display region A2. (5) A first gate insulating layer 031 (i.e., a portion of the inorganic insulating layer 03) is formed on the side of the first gate metal layer 011 away from the second gate insulating layer 07. The first gate insulating layer 031 here has not been etched, that is, the first gate insulating layer 031 is not provided with the second via hole K12. (6) A second gate metal layer 012 (i.e., another portion of the gate metal layer 01) is formed on the side of the first gate insulating layer 031 away from the first gate metal layer 011. FIG. 8 shows only the second gate metal layer 012 formed in the display region A1. Then, through the following processes, another portion of the inorganic insulating layer 03, that is, the interlayer dielectric (ILD) layer 032 may be formed, and the second via hole K12 penetrating the inorganic insulating layer 03 and the second gate insulating layer may be acquired by etching.

Figure 9:
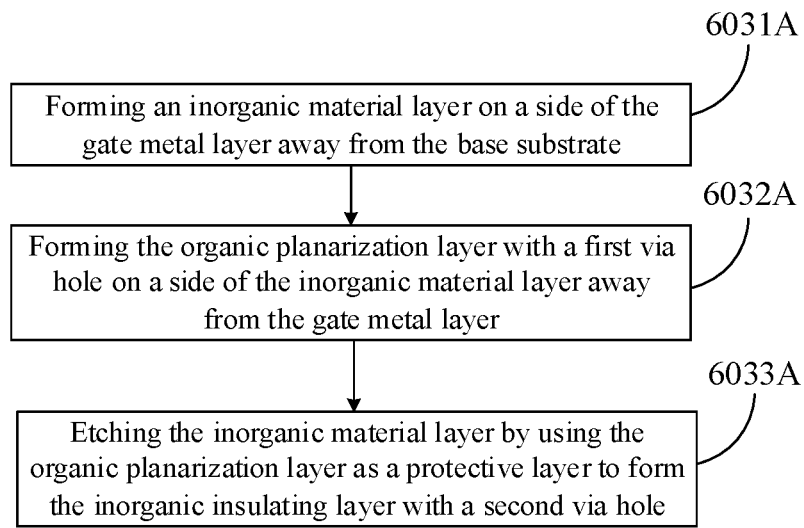
FIG. 9 is a flowchart of a method for manufacturing an inorganic insulating layer and organic planarization layer according to an embodiment of the present disclosure.

As an optional implementation, by taking an example in which the display panel shown in FIG. 4 is to be formed, as shown in FIG. 9, the foregoing step 603 may include the following steps.

In step 6031A, an inorganic material layer is formed on a side of the gate metal layer away from the base substrate.

Figure 10:
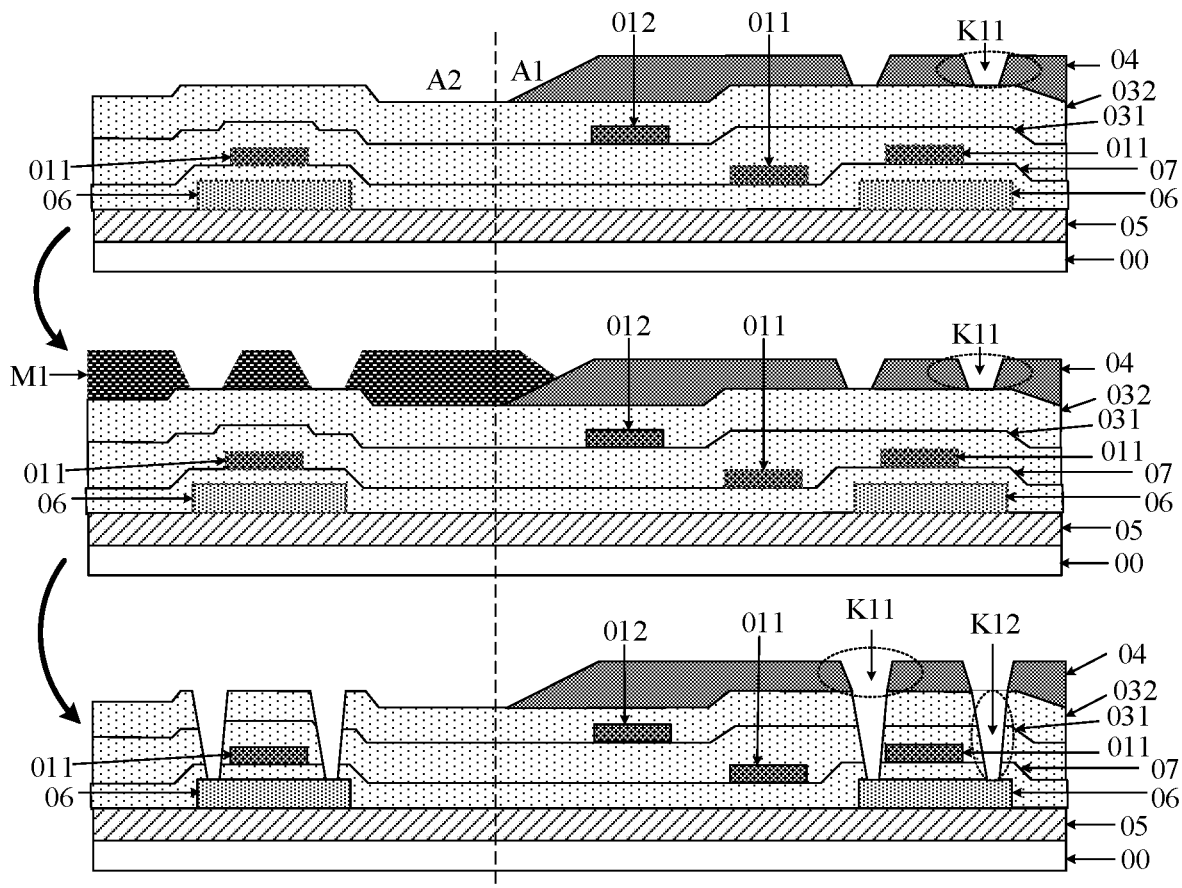
FIG. 10 is another partial schematic diagram in a flowchart of a manufacturing process according to an embodiment of the present disclosure.

Optionally, according to the process flowcharts shown in FIG. 8 and FIG. 10, the inorganic material layer here may include an inorganic material layer for forming the interlayer dielectric (ILD) layer 032, and an inorganic material layer for forming the first gate insulating layer 031. In addition, the inorganic material layer may be formed by deposition.

In step 6032A, the organic planarization layer with a first via hole is formed on a side of the inorganic material layer away from the gate metal layer.

Optionally, with reference to FIG. 10, the organic planarization layer 04 with the first via hole K11 may be formed only in the display region A1. In addition, the organic planarization layer 04 may be formed by a mask-related patterning process.

Since the source/drain metal layer 02 in the non-display region A2 also needs to be connected to the active layer 06, a photoresist pattern may then be formed on the side of the inorganic material layer away from the gate metal layer 01 in the non-display region A2. The photoresist pattern MI may be provided with a via hole, and the photoresist pattern MI with the via hole may be formed by a mask-related patterning process.

In step 6033A, the inorganic material layer is etched by using the organic planarization layer as a protective layer to form the inorganic insulating layer with a second via hole.

Optionally, referring to FIG. 10, in the display region A1, the inorganic material layer may be etched by etching by using the organic planarization layer 04 as a protective layer, to acquire the inorganic insulating layer with the second via hole K12. The second gate insulating layer 07 may also be etched until the active layer 06 is exposed.

In addition, for the non-display region A2, the same etching may be adopted, but the inorganic material layer and the second gate insulating layer 07 are etched by using the formed photoresist pattern MI as a protective layer, so as to expose the active layer 06. In this way, the above-mentioned step 6022 is to form a source/drain metal layer on the side of the organic planarization layer away from the base substrate.

By using the manufacturing process shown in FIG. 9, the display panel with the structure shown in FIG. 4 can be acquired by etching without considering the alignment accuracy of the first via hole K1 penetrating the organic planarization layer 04 and the second via hole K12 penetrating the inorganic insulating layer 03. That is, in the acquired display panel, the orthographic projection of the first via hole K11 on the base substrate 00 may overlap the orthographic projection of the second via hole K12 on the base substrate 00. In other words, the opening of the first via hole K11 and the opening of the second via hole K12 have the same size at the intersection of the two via holes. In this way, the influence of the first via hole K11 penetrating the organic planarization layer 04 on the flatness of other film layers (e.g., pixel electrode) disposed thereon can be reduced, thereby avoiding the adverse influence on light emission of the pixels.

Figure 11:
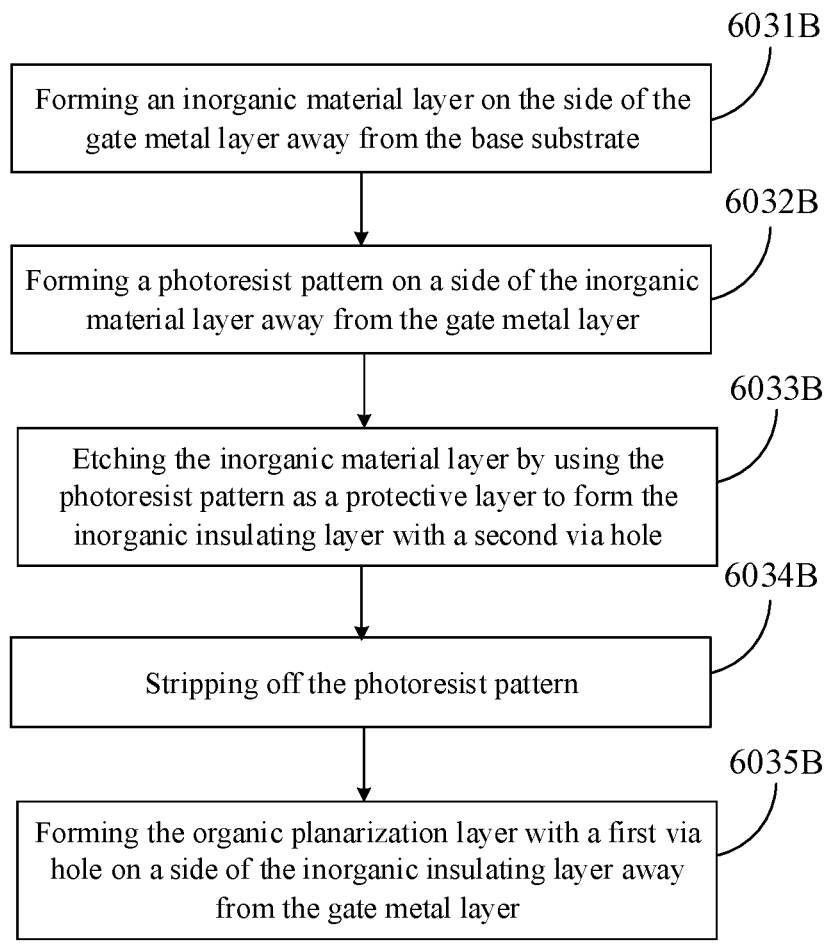
FIG. 11 is a flowchart of another method for manufacturing an inorganic insulating layer and organic planarization layer according to an embodiment of the present disclosure.

As another optional implementation, by taking an example in which the display panel shown in FIG. 5 is to be formed, as shown in FIG. 11, the foregoing step 603 may include the following steps.

In step 6031B, an inorganic material layer is formed on the side of the gate metal layer away from the base substrate.

For this step, reference may be made to the above-mentioned step 6031A, and details are not repeated here.

In step 6032B, a photoresist pattern is formed on the side of the inorganic material layer away from the gate metal layer.

Figure 12:
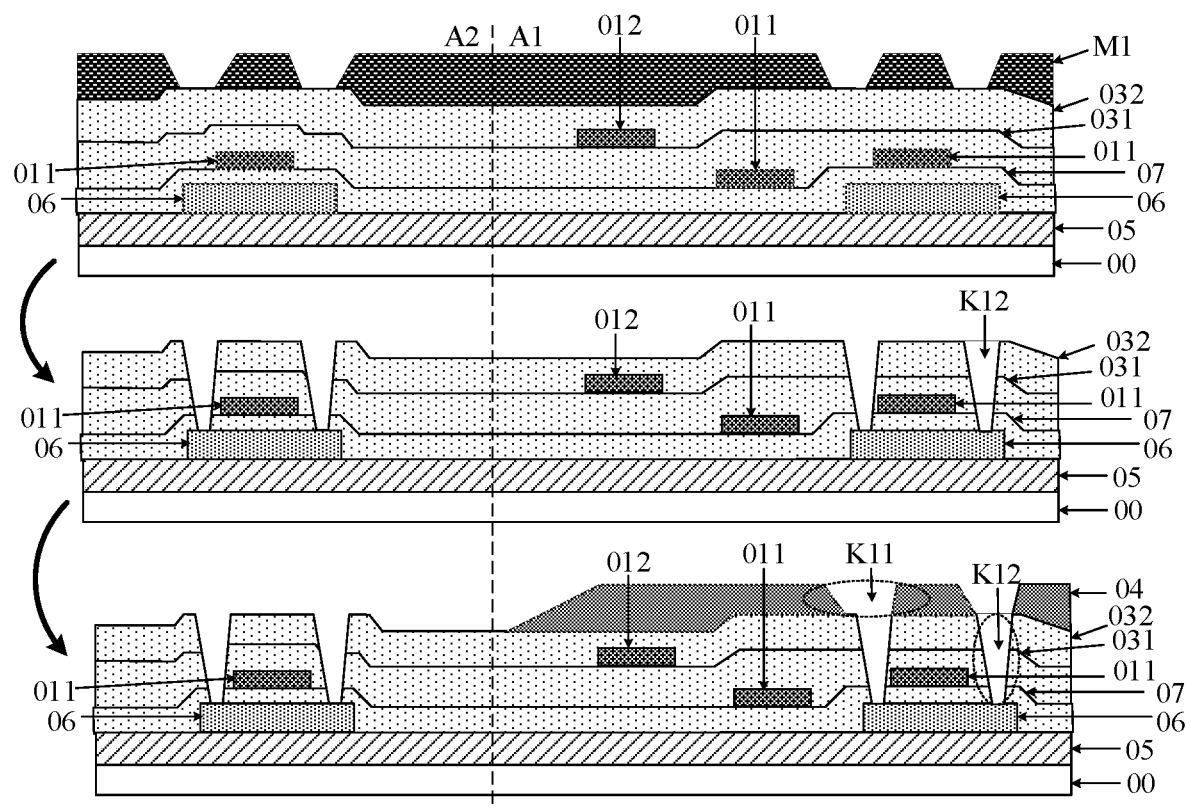
FIG. 12 is another partial schematic diagram in a flowchart of a manufacturing process according to an embodiment of the present disclosure.

With reference to the process flowchart shown in FIG. 12, after the inorganic material layer is formed, a photoresist pattern may be formed directly on the side of the inorganic material layer away from the gate metal layer. The photoresist pattern is disposed in the display region A1 and the non-display region A2, and the photoresist pattern is provided with via holes.

Optionally, the photoresist pattern MI with via holes may be formed by a mask-related patterning process.

In step 6033B, the inorganic material layer is etched by using the photoresist pattern as a protective layer to form an inorganic insulating layer with a second via hole.

Still referring to FIG. 12, in the display area A1, the inorganic material layer may be etched by means of etching by using the photoresist pattern as a protective layer, to form an inorganic insulating layer with a second via hole K12. In addition, the second gate insulating layer 07 may also be etched until the active layer 06 is exposed. The non-display area A2 is the same as the display area A1, and details are not repeated one by one here.

In step 6034B, the photoresist pattern is stripped off.

After the second via hole K12 is acquired by etching, with reference to the process flowchart shown in FIG. 12, the photoresist pattern may be stripped off by a stripping-process (e.g., laser peeling).

In step 6035B, an organic planarization layer with a first via hole is formed on a side of the inorganic insulating layer away from the gate metal layer.

Then, the organic planarization layer 04 with the first via hole K1/ is formed on the side, away from the base substrate 00, of the inorganic insulating layer 03 with the second via hole K12. Optionally, the organic planarization layer 04 may be formed by a mask-related patterning process.

In this manufacturing method, the inorganic insulating layer 03 and the second gate insulating layer 07 are etched first, and then the organic planarization layer 04 is formed. Therefore, it is necessary to consider the alignment accuracy of the first via hole K1/ penetrating the organic planarization layer 04 and the second via hole K12 penetrating the inorganic insulating layer 03, so as to ensure that the source/drain metal layer 02 formed on the organic planarization layer 04 can be reliably connected to the active layer 06 through the first via hole K1/ and the second via hole K12. In this case, referring to the structures shown in FIG. 5 and FIG. 12, at the intersection of the first via hole K1/ and the second via hole K12, the opening of the first via hole K1/ has a bigger size than the opening of the second via hole K12.

Figure 13:
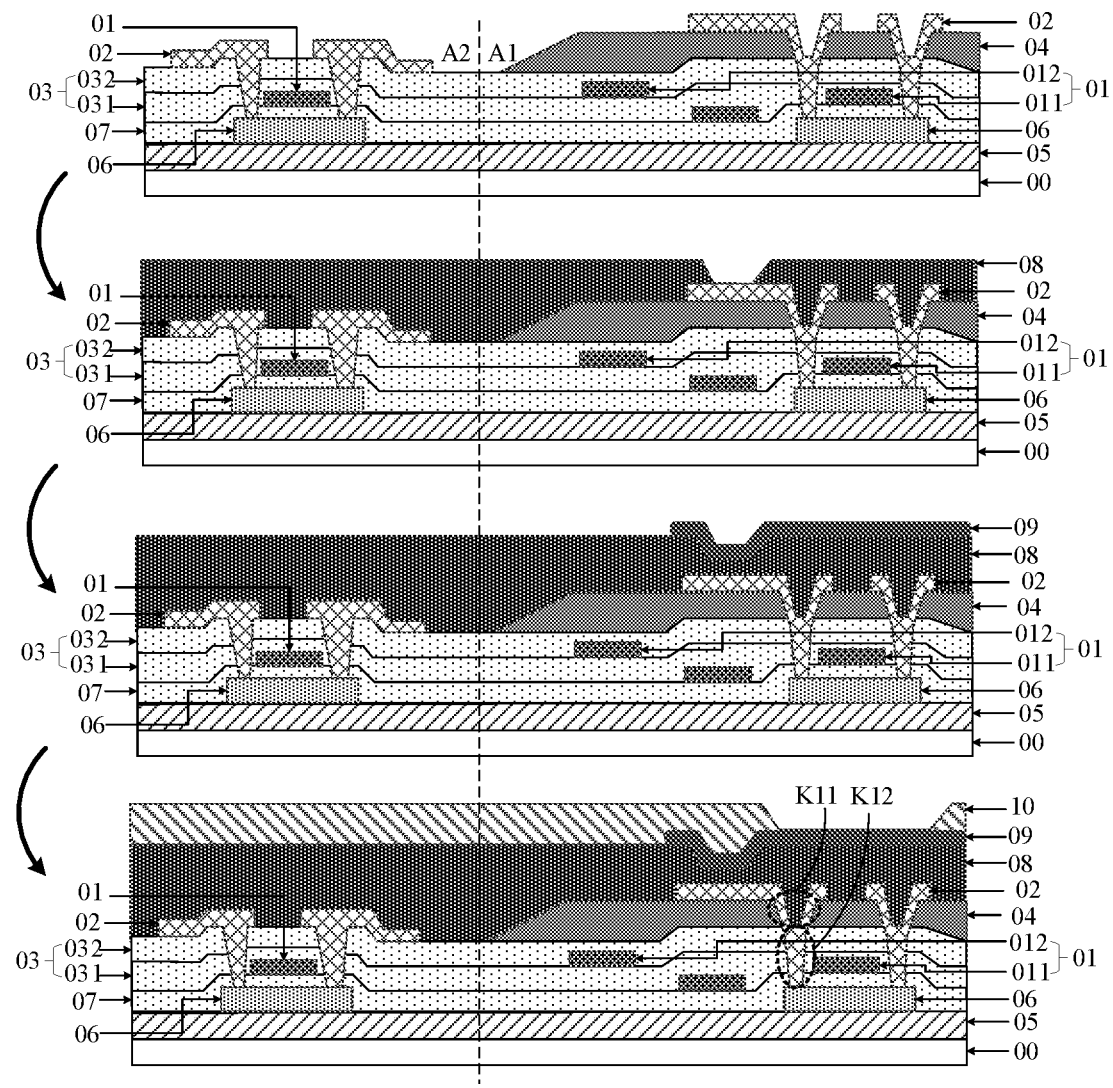
FIG. 13 is still another partial schematic diagram in a flowchart of a manufacturing process according to an embodiment of the present disclosure.
Figure 15:
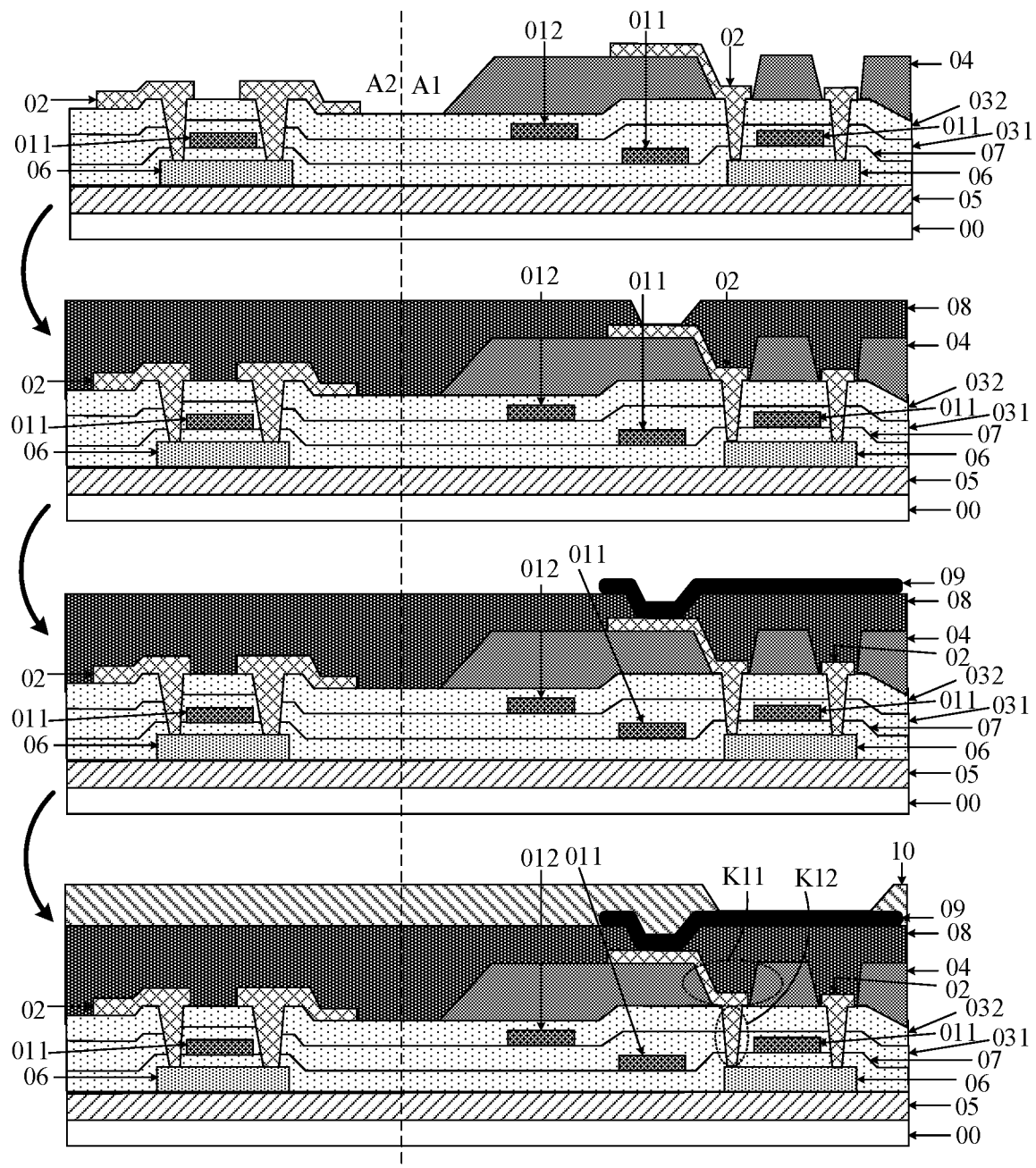
FIG. 15 is still another partial schematic diagram in a flowchart of a manufacturing process according to an embodiment of the present disclosure.

Optionally, in order to form the display panel shown in FIG. 4 or FIG. 5, after the above step 603 is executed, in combination with the process flowcharts shown in FIG. 13 and FIG. 15, the manufacturing method may further include the followings.

(1) A source/drain metal layer 02 is formed on the side of the organic planarization layer 04 away from the base substrate 00, and the source/drain metal layer 02 is arranged to be connected to the active layer 06 through a via hole. The source/drain metal layer 02 may be formed in the display region A1 and the non-display region A2, and the source/drain metal layer 02 in the display region A1 may extend to the active layer 06 through the first via hole K1/ and the second via hole K12, and be connected to the active layer 06. The source/drain metal layer 02 in the non-display region A2 may extend to the active layer 06 through the second via hole K12 and be connected to the active layer 06. In addition, for the flowchart shown in FIG. 10, before the source/drain metal layer 02 is formed, the photoresist pattern MI formed in the non-display region A2 is stripped off. (2) A target planarization layer 08 is formed on the side of the source/drain metal layer 02 away from the base substrate 00. The target planarization layer 08 may be formed in both the display region A1 and the non-display region A2. (3) The pixel electrode 09 is formed on the side of the target planarization layer 08 away from the base substrate 00, and the pixel electrode 09 is formed in the display region A1 only. (4) The pixel definition layer 10 is formed on the side of the pixel electrode 09 away from the base substrate 00. The pixel definition layer 10 may be formed in both the display region A1 and the non-display region A2.

Figure 14:
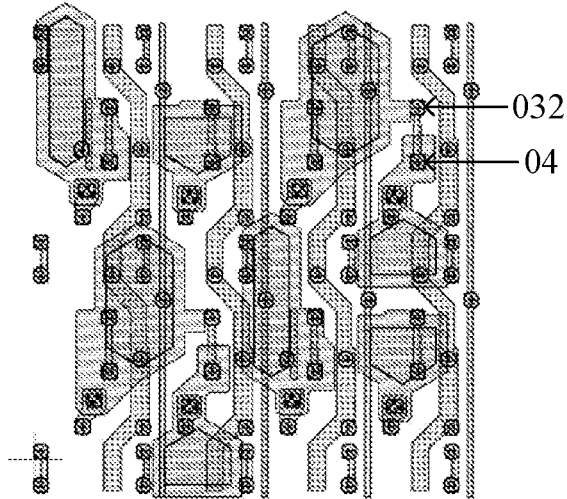
FIG. 14 is a layout of partial film layers of a display panel according to an embodiment of the present disclosure.
Figure 16:
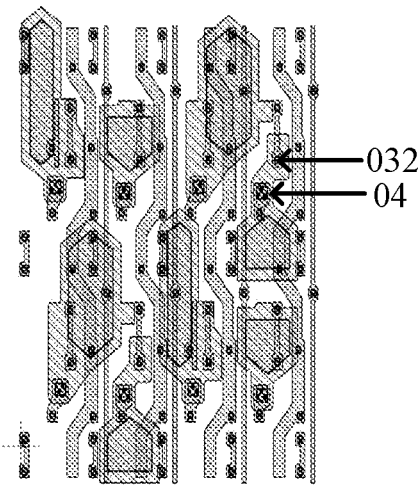
FIG. 16 is a layout of partial film layers of another display panel according to an embodiment of the present disclosure.

FIG. 13 shows a manufacturing process performed after the manufacturing processes shown in FIG. 9 and FIG. 10. FIG. 15 shows a manufacturing process performed after the manufacturing processes shown in FIG. 11 and FIG. 12. Comparing FIG. 13 with FIG. 15, it can be known that due to different manufacturing processes in step 603, the finally formed first via hole K11 and the second via hole K12 have different sizes. To reflect the difference in size, FIG. 14 and FIG. 16 show the structural layouts of the display panels corresponding to FIG. 4 and FIG. 5, respectively. Comparing FIG. 14 with FIG. 16, it can be known that the first via hole K11 and the second via hole K12 formed by different manufacturing methods have different sizes.

In summary, the embodiment of the present disclosure provides a method for manufacturing a display panel. The display panel manufactured by this method further includes an organic planarization layer between the gate metal layer and the source/drain metal layer, and the orthographic projection of the organic planarization layer on the base substrate overlaps the overlapped portion of the orthographic projection of the gate metal layer on the base substrate and the orthographic projection of the source/drain metal layer on the base substrate. Therefore, the distance between the gate metal layer and the source/drain metal layer is increased, and accordingly, the capacitance value of the overlap capacitance formed by the gate metal layer and the source/drain metal layer is reduced. In this way, the capacitive load brought by the overlap capacitance is smaller, and the power consumption of the driver IC driving the display panel to display is lower.

Figure 17:
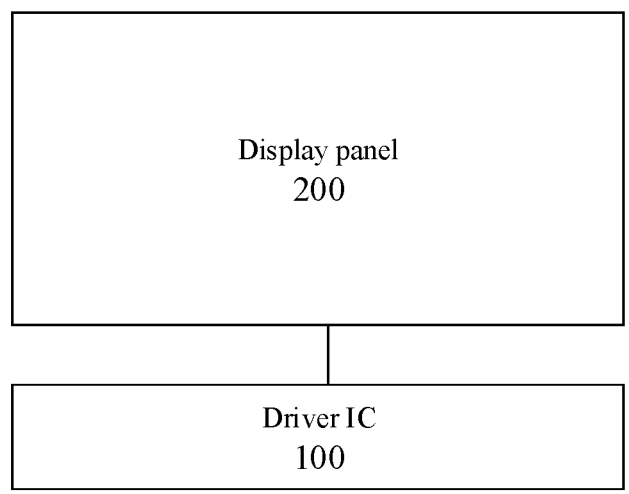
FIG. 17 is a schematic structural diagram of a display device according to an embodiment of the present disclosure.

FIG. 17 is a schematic structural diagram of a display device according to an embodiment of the present disclosure. As shown in FIG. 17, the display device may include a driver IC 100 and a display panel 200 as shown in any one of FIGS. 1 to 5. The driver IC 100 may be connected to the display panel 200 and may be configured to drive the display panel 200 to display.

Optionally, the display device may be any product or component with a display function, such as an AMOLED display device, a liquid crystal display device, a mobile phone, a tablet computer, a television, a display, a notebook computer or the like.

It should be understood that the terms "first", "second" and the like in the description of the embodiments of the present disclosure and claims and the above-mentioned drawings are used to distinguish similar objects, but not necessarily used to describe a specific order or sequence.

Described above are optional embodiments of the present disclosure, and are not intended to limit the present disclosure. Any modifications, equivalent replacements, improvements and the like made within the spirit and principles of the present disclosure should be included within the scope of protection of the present disclosure.

What is claimed is:

1. A display panel, comprising:
   a base substrate;
   a gate metal layer and a source/drain metal layer sequentially laminated on a side of the base substrate along a direction away from the base substrate; and
   an inorganic insulating layer and an organic planarization layer sequentially laminated between the gate metal layer and the source/drain metal layer along the direction away from the base substrate;
   wherein an orthographic projection of the gate metal layer on the base substrate and an orthographic projection of the source/drain metal layer on the base substrate have an overlapped portion, and an orthographic projection of the organic planarization layer on the substrate overlaps the overlapped portion; and
   the base substrate is provided with a display region and a non-display region surrounding the display region; wherein the organic planarization layer is disposed in the display region and is not disposed in the non-display region; and each of the source/drain metal layer, the gate metal layer and the inorganic insulating layer is disposed in both the display region and the non-display region.

2. The display panel according to claim 1, wherein the orthographic projection of the organic planarization layer on the base substrate covers the overlapped portion.

3. The display panel according to claim 1, wherein a dielectric constant of a material of the organic planarization layer is greater than or equal to 3 and less than or equal to 4.

4. The display panel according to claim 1, wherein
   the gate metal layer comprises: a first gate metal layer and a second gate metal layer sequentially laminated along a direction away from the base substrate; and
   the inorganic insulating layer comprises:
      a first gate insulating layer disposed between the first gate metal layer and the second gate metal layer; and
      an interlayer dielectric (ILD) layer disposed between the second gate metal layer and the source/drain metal layer.

5. The display panel according to claim 1, further comprising:
   an inorganic layer substrate, an active layer and a second gate insulating layer disposed between the gate metal layer and the base substrate and sequentially laminated along a direction away from the base substrate; and
   a target planarization layer, a pixel electrode and a pixel definition layer sequentially laminated on a side of the source/drain metal layer away from the base substrate;
   wherein the source/drain metal layer is connected to the active layer through a via hole penetrating the organic planarization layer, the inorganic insulating layer and the second gate insulating layer.

6. The display panel according to claim 5, wherein the via hole comprises: a first via hole penetrating the organic planarization layer, and a second via hole penetrating the inorganic insulating layer and the second gate insulating layer, wherein
   an orthographic projection of an opening, close to the base substrate, of the first via hole on the base substrate coincides with an orthographic projection of an opening, away from the base substrate, of the second via hole on the base substrate.

7. The display panel according to claim 6, wherein
   the base substrate is provided with a display region and a non-display region surrounding the display region; wherein the organic planarization layer is disposed in the display region; and each of the source/drain metal layer, the gate metal layer and the inorganic insulating layer is disposed in the display region and the non-display region;
   the orthographic projection of the organic planarization layer on the base substrate covers the overlapped portion;

a dielectric constant of a material of the organic planarization layer is greater than or equal to 3 and less than or equal to 4; and the gate metal layer comprises: a first gate metal layer and a second gate metal layer sequentially laminated along a direction away from the base substrate; and the inorganic insulating layer comprises: a first gate insulating layer disposed between the first gate metal layer and the second gate metal layer, and an interlayer dielectric (ILD) layer disposed between the second gate metal layer and the source/drain metal layer.

8. A method for manufacturing a display panel, comprising:

providing a base substrate;

forming a gate metal layer on a side of the base substrate;

forming a source/drain metal layer on a side of the gate metal layer away from the base substrate; and forming an inorganic insulating layer and an organic planarization layer sequentially laminated between the gate metal layer and the source/drain metal layer along a direction away from the base substrate;

wherein an orthographic projection of the gate metal layer on the base substrate and an orthographic projection of the source/drain metal layer on the base substrate have an overlapped portion, and an orthographic projection of the organic planarization layer on the substrate overlaps the overlapped portion; and the base substrate is provided with a display region and a non-display region surrounding the display region; wherein the organic planarization layer is disposed in the display region and is not disposed in the non-display region; and each of the source/drain metal layer, the gate metal layer and the inorganic insulating layer is disposed in both the display region and the non-display region.

9. The method according to claim 8, wherein forming the inorganic insulating layer and the organic planarization layer sequentially laminated between the gate metal layer and the source/drain metal layer along the direction away from the base substrate comprises:

forming an inorganic material layer on the side of the gate metal layer away from the base substrate;

forming the organic planarization layer with a first via hole on a side of the inorganic material layer away from the gate metal layer; and etching the inorganic material layer by using the organic planarization layer as a protective layer to form the inorganic insulating layer with a second via hole;

wherein an orthographic projection of the first via hole on the base substrate overlaps an orthographic projection of the second via hole on the base substrate.

10. The method according to claim 8, wherein forming the inorganic insulating layer and the organic planarization layer sequentially laminated between the gate metal layer and the source/drain metal layer along the direction away from the base substrate comprises:

forming an inorganic material layer on the side of the gate metal layer away from the base substrate;

forming a photoresist pattern on a side of the inorganic material layer away from the gate metal layer;

etching the inorganic material layer by using the photoresist pattern as a protective layer to form the inorganic insulating layer with a second via hole;

stripping off the photoresist pattern; and forming the organic planarization layer with a first via hole on a side of the inorganic insulating layer away from the gate metal layer;

wherein an orthographic projection of the first via hole on the base substrate overlaps an orthographic projection of the second via hole on the base substrate.

11. A display device, comprising: a driver IC, and a display panel; wherein the display panel comprises:

a base substrate;

a gate metal layer and a source/drain metal layer sequentially laminated on a side of the base substrate along a direction away from the base substrate; and an inorganic insulating layer and an organic planarization layer sequentially laminated between the gate metal layer and the source/drain metal layer along the direction away from the base substrate; wherein an orthographic projection of the gate metal layer on the base substrate and an orthographic projection of the source/drain metal layer on the base substrate have an overlapped portion, and an orthographic projection of the organic planarization layer on the substrate overlaps the overlapped portion; and the base substrate is provided with a display region and a non-display region surrounding the display region; wherein the organic planarization layer is disposed in the display region and is not disposed in the non-display region; and each of the source/drain metal layer, the gate metal layer and the inorganic insulating layer is disposed in both the display region and the non-display region;

wherein the driver IC is connected to the display panel and configured to drive the display panel to display.

12. The display device according to claim 11, wherein the orthographic projection of the organic planarization layer on the base substrate covers the overlapped portion.

13. The display device according to claim 11, wherein a dielectric constant of a material of the organic planarization layer is greater than or equal to 3 and less than or equal to 4.

* * * * *